US012689328B2

(12) United States Patent
Lu et al.

(10) Patent No.: US 12,689,328 B2
(45) Date of Patent: Jul. 21, 2026

(54) DIGITALLY CONTROLLED OSCILLATOR

(71) Applicant: NXP B.V., Eindhoven (NL)

(72) Inventors: Chuang Lu, Eindhoven (NL); Nenad Pavlovic, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/819,764

(22) Filed: Aug. 29, 2024

(65) Prior Publication Data

US 2026/0066849 A1    Mar. 5, 2026

(51) Int. Cl.
| | |
|---|---|
| H03B 5/12 | (2006.01) |
| H03B 5/04 | (2006.01) |
| H03L 7/099 | (2006.01) |

(52) U.S. Cl.
CPC ............. H03B 5/1265 (2013.01); H03B 5/04 (2013.01); H03B 5/1212 (2013.01); H03B 5/1228 (2013.01); H03L 7/0991 (2013.01)

(58) Field of Classification Search
CPC .. H03B 5/1265; H03B 5/1228; H03B 5/1212; H03B 5/1215; H03B 5/1206; H03B 2201/0283; H03L 2207/50; H03L 7/099; H03L 7/0995; H03K 3/0315; H03K 3/0322
See application file for complete search history.

(56) References Cited

U.S. PATENT DOCUMENTS

| | | | |
|---|---|---|---|
| 9,337,850 B2 | 5/2016 | Moehlmann | |
| 10,191,453 B2 | 1/2019 | Pavlovic et al. | |
| 10,992,304 B2 | 4/2021 | Pavao Moreira et al. | |
| 2013/0093523 A1* | 4/2013 | Nakamura | .............. H03L 7/185 |
| | | | 331/34 |
| 2016/0241301 A1 | 8/2016 | Pavlovic et al. | |
| 2018/0191364 A1* | 7/2018 | Pavlovic | ............. H03M 1/0854 |
| 2019/0068201 A1 | 2/2019 | Li et al. | |
| 2021/0194430 A1* | 6/2021 | van den Heuvel | .. H03C 3/0941 |
| 2024/0080031 A1 | 3/2024 | Pavlovic et al. | |

OTHER PUBLICATIONS

Wanghua Wu, Robert Bogdan Staszewski, John R. Long, "A 56.4-to-63.4 GHz Multi-Rate All-Digital Fractional-N PLL for FMCW Radar Applications in 65 nm CMOS" in IEEE Journal of Solid-State Circuits, vol. 49, No. 5, pp. 1081-1096, May 2014.

(Continued)

*Primary Examiner* — Ryan Johnson
(74) *Attorney, Agent, or Firm* — Andrew C. Milhollin

(57) ABSTRACT

The present disclosure relates to an oscillator, such as a Digitally Controlled Oscillator (DCO), having first capacitor banks coupled to a first path and a second path, the first path connecting a first node to a first output node, and the second path connecting a second node to a second output node, and second capacitor banks coupled to a third path and a fourth path, the third path being connected to the first node, the fourth path being connected to the second node, the first and second paths being separate from the third and fourth paths, and the second capacitor banks including at least one modulation capacitor bank.

17 Claims, 3 Drawing Sheets

(56) References Cited

OTHER PUBLICATIONS

Shen Zhengkun et al: "A 12-GHz Calibration-Free All-Digital PLL for FMCW Signal Generation With 78 MHz/[mu]s Chirp Slope and High Chirp Linearity", IEEE Transactions on Circuits and Systems I: Regular Papers, IEEE, US, vol. 67, No. 12, Dec. 1, 2020, pp. 4445-4456, Xu Jianfei et al: "A 24 GHz High Frequency-Sweep Linearity FMCW Signal Generator with Floating-Shield Distributed Metal Capacitor Bank", IEEE Microwave and Wireless Components Letters, IEEE Service Center, New York, NY, US, vol. 27, No. 1, Jan. 1, 201, pp. 52-54

* cited by examiner

300

302

304

306

322

318

324          320

330                    332

308          $C_{PVT}$

310          $C_{ACQ}$

312          $C_{mod\_coarse}$

314          $C_{mod\_fine}$

316          $C_{TRK}$ 334          336

326          328

PLL_out

DIGITALLY CONTROLLED OSCILLATOR

TECHNICAL FIELD

Embodiments of the subject matter described herein relate generally to oscillators, such as Digitally Controlled Oscillators that may be used in phase-locked loop (PLL) circuitry.

BACKGROUND

Phase-locked loops (PLLs) are widely employed in radio, telecommunications, computers and other electronic applications. PLLs can be used to demodulate a signal, recover a signal from a noisy communication channel, generate a stable frequency at multiples of an input frequency, or distribute precisely timed clock pulses in digital logic circuits such as microprocessors. For example, in range sensing applications using radar technology, linearly frequency-modulated signals are used, which are generated by a PLL that includes a frequency-modulated oscillator. Distances to objects or persons are determined based on the frequency difference between transmitted and reflected waves. The accuracy of these distance measurements is very sensitive to deviations and errors in the linearly frequency-modulated signals (e.g., chirps) generated by the oscillator of the PLL.

BRIEF DESCRIPTION OF DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
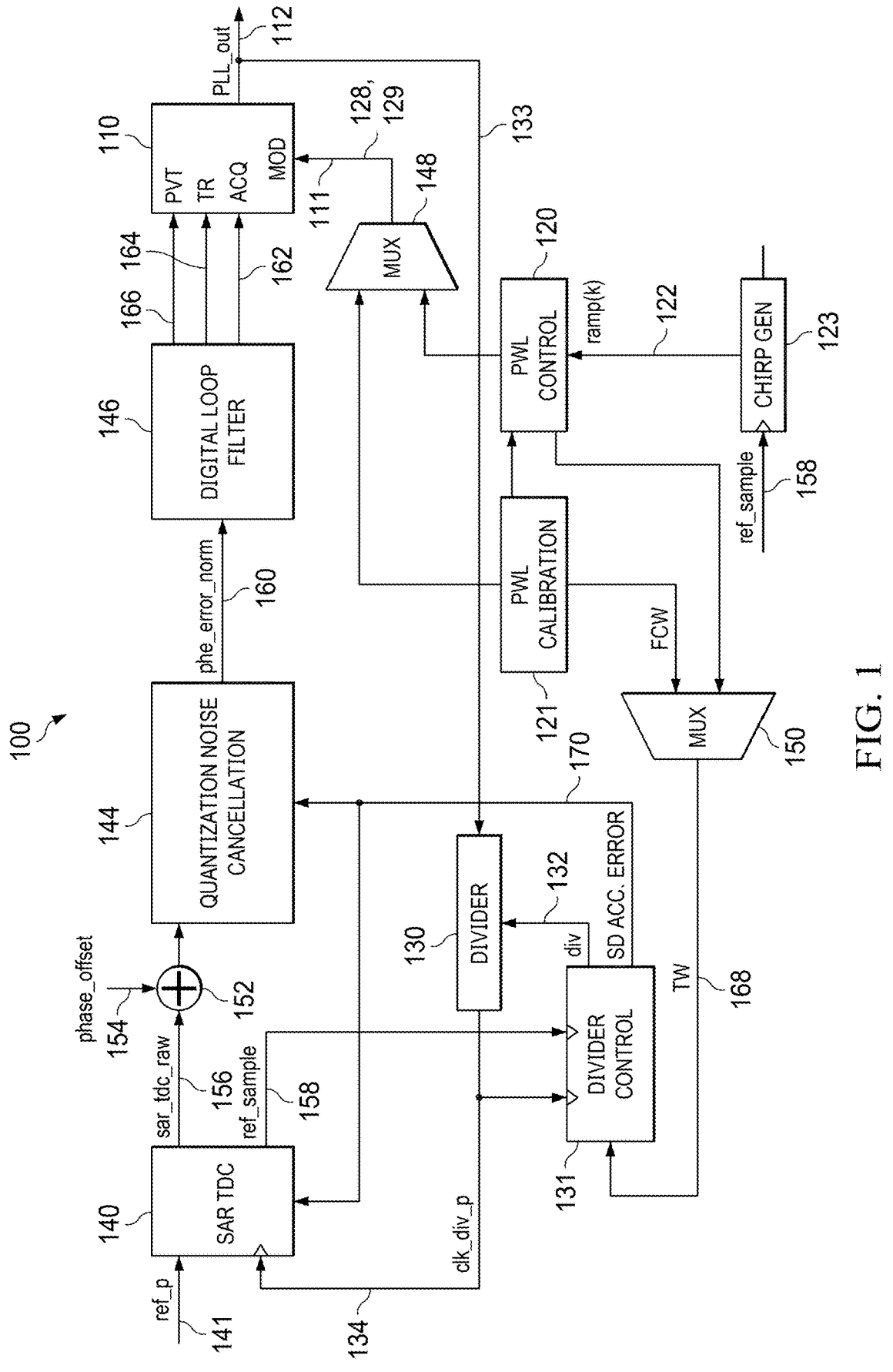
FIG. 1 shows an illustrative block diagram of a phase-locked loop (PLL) circuitry that includes a Digitally Controlled Oscillator (DCO), in accordance with various embodiments.

The following detailed description is merely illustrative in nature and is not intended to limit the embodiments described herein and uses of such embodiments. Furthermore, there is no intention to be bound by any expressed or implied theory presented in the preceding technical field, background, or the following detailed description.

For simplicity and clarity of illustration, the figures illustrate the general manner of construction. Descriptions and details of well-known features and techniques may be omitted from the following detailed description to avoid unnecessarily obscuring the present disclosure. For example, the dimensions of some of the elements or regions in the figures may be exaggerated relative to other elements or regions to help improve understanding of embodiments described herein.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. As used herein the terms "approximate," "approximately," "substantial" and "substantially" mean sufficient to accomplish the stated purpose in a practical manner and that minor imperfections, if any, are not significant for the stated purpose.

Along these lines, when used with references to measurable quantities including, but not limited to, dimensions, these terms mean that the quantities are equal to the values stated subject to accepted tolerances of any methods or apparatus chosen to fabricate the described structures or measure the quantities or dimensions described. Directional references such as "top," "bottom," "left," "right," "above," "below," and so forth, unless otherwise stated, are not intended to require any preferred orientation and are made with reference to the orientation of the corresponding figure or figures for purposes of illustration. As used herein, the words "exemplary" and "example" mean "serving as an example, instance, or illustration." Any implementation described herein as exemplary or an example is not necessarily to be construed as preferred or advantageous over other implementations. In addition, certain terms may also be used herein for reference only, and thus are not intended to be limiting.

As used herein the terms "circuit" and "circuitry," and related terminology means any suitable combination(s) of analog or digital circuit elements. Herein, elements or nodes or features are sometimes referred to as being "connected" or "coupled" together. As used herein, unless expressly stated otherwise, "connected" means that one element is directly joined to (or directly communicates with) another element in an electrical or non-electrical manner, and not necessarily mechanically. Likewise, unless expressly stated otherwise, "coupled" means that one element is directly or indirectly joined to (or directly or indirectly communicates with) another element in an electrical or non-electrical manner, and not necessarily mechanically. Thus, although the schematic illustrations shown in the figures depict exemplary arrangements of elements, additional intervening elements, devices, features, or components may be present in one or more embodiments of the depicted subject matter.

Various embodiments described herein relate to an oscillator, such as a Digitally Controlled Oscillator (DCO), having modulation capacitor banks and other capacitor banks (e.g., capacitor banks for Process-Voltage-Temperature (PVT) compensation, capacitor banks for phase locking for a phase-locked loop (PLL) that includes the DCO, or a combination of these) that are coupled to nodes of a transconductance stage along respectively different paths (e.g., in a star configuration). Such an arrangement of capacitor banks may reduce or mitigate the effect of parasitic inductance from the other capacitor banks on the modulation capacitor banks, where calibration of the modulation capacitor banks might otherwise be invalidated by such parasitic inductance when the states of the other capacitor banks change (e.g., due to change in a lock state of the PLL). In one or more embodiments, the DCO may be implemented as part of Phase-Locked Loop (PLL) circuitry, which may have an All-Digital PLL (ADPLL) architecture.

In one or more embodiments, the DCO includes a fine modulation capacitor bank, a coarse modulation capacitor bank, a PVT capacitor bank, an acquisition capacitor bank, a tracking capacitor bank, and a negative transconductance stage. The PVT capacitor bank, the acquisition capacitor bank, and the tracking capacitor bank may each be coupled a first path and a second path, where the first path connects a positive node at the negative transconductance stage to a first output node and the second path connects a negative node at the negative transconductance stage to a second output node. The PVT capacitor bank may be controlled to compensate for variations in process, supply voltage, and temperature of the DCO. The acquisition and tracking capacitor banks may be controlled (with different discrete step sizes) to acquire a phase lock for the PLL. The fine modulation capacitor bank and the coarse modulation capacitor bank may be coupled to a third path and a fourth path, where the third path is connected to the positive node and the fourth path is connected to the negative node. The fine modulation capacitor bank and the coarse modulation capacitor bank may be controlled to cause modulation (e.g., linear frequency modulation; chirping) of one or more output signals provided at the first and second output nodes of the DCO. The third and fourth paths are separate from the first and second paths.

In one or more embodiments, the capacitor banks of the DCO may be arranged between the negative transconductance block and the output nodes in order of descending step size, where the step size of a given capacitor bank may correspond to a capacitive block size of that capacitor bank, and may define the smallest discrete amount by which that capacitor bank's capacitance may be increased or decreased.

FIG. 1 shows a block diagram of phase-locked loop (PLL) circuitry 100 having an all-digital phase-locked loop (ADPLL) architecture. The PLL circuitry 100 includes a Digitally Controlled Oscillator (DCO) 110, piecewise linear (PWL) control circuitry 120, PWL calibration circuitry 121, chirp generation circuitry 123, a frequency divider 130, divider control circuitry 131, a successive approximation register (SAR) Time-to-Digital Converter (TDC) 140 (e.g., which may function as a phase detector), quantization noise cancellation circuitry 144, digital loop filter circuitry 146, multiplexers (MUXs) 148 and 150, and an adder circuitry 152.

A clock reference input 141 ("ref_p") and a frequency-divided output signal 134 ("clk_div_p") are provided to respective inputs of the SAR TDC 140. The SAR TDC determines the time difference between the clock reference input 141 and the frequency-divided output signal 134. The frequency-divided output signal 134 is provided to the SAR TDC 140 by the frequency divider 130. The frequency divider 130 receives an output signal 112 ("PLL_out"), corresponding to the output of the PLL circuitry 100, from the DCO 110 and divides the frequency thereof, so that the clock reference input 141, when provided at a relatively low frequency, can still be used to generate a relatively high frequency output signal 112 with suitable precision. In one or more embodiments, the output signal 112 is a differential output signal that includes a pair of signals having opposite polarities (a "differential pair"). The frequency divider 130 is controlled by the divider control circuitry 131, which may include a sigma-delta modulator. In this way, the frequency divider 130 and the divider control circuitry 131 together provide for fractional frequency dividing (e.g., allowing for fractional-n frequency control).

The divider control circuitry 131 provides a divider value 132 ("div") to the frequency divider 130 and an accumulated sigma-delta error 170 ("SD acc. error") to the quantization noise cancelling block 144. The divider control circuitry 131 is configured to receive a frequency control word 168 ("FCW") from the PWL control circuitry 120 or the PWL calibration circuitry 121 via the MUX 150. The divider control circuitry 131 is configured to then to control the frequency divider 130 to provide the output signal 112 at the desired output frequency from the ADPLL (with reference to the clock reference input 141). The divider control circuitry 131 receives the re-clocked reference signal 158 ("ref_sample") from the SAR TDC 140 and the frequency divided output signal 134 that is output by the frequency divider 130.

A phase offset signal 154 ("phase_offset") is added, by the adder circuitry 152, to a SAR TDC signal 156 ("sar_tdc_raw") that is provided by the SAR TDC 140, and the resultant phase-offset SAR TDC signal is provided to the quantization noise cancellation circuitry 144. The quantization noise cancelling circuitry 144 is configured to reduce quantization noise that may be introduced, for example, by the frequency divider 130. The quantization noise cancelling circuitry 144 may be configured to cancel or reduce such noise in the digital domain.

A noise-mitigated phase error signal 160 ("phe_error_norm"), corresponding to the phase-offset SAR TDC signal after undergoing quantization noise cancellation or reduction by the quantization noise cancellation circuitry 144, is provided by the quantization noise cancelling circuitry 144 to the digital loop filter circuitry 146. For example, the noise-mitigated phase error signal 160 may represent the phase error of the clock reference input 141, as determined by the SAR TDC 140. The digital loop filter circuitry 146 is configured to convert the noise-mitigated phase error signal 160 into digital output signals for controlling the DCO 110 so as to minimize or reduce the phase error represented by the noise-mitigated phase error signal 160.

During normal operation, the PLL circuitry 100 is configured to compare the phase of the clock reference signal 141 with the phase of frequency-divided output signal 134 (derived from the output signal 112 of the PLL circuitry 100) and to adjust the DCO 110 to keep the phases of the two signals matched (e.g., within a predefined tolerance, which may be defined based on a predetermined phase difference threshold). The PLL circuitry 100 also supports two-point modulation through the chirp generation circuitry 123, the PWL control circuitry 120, and the PWL control circuitry 121. For example, the chirp generation circuitry 123 may generate a ramp signal 122 (ramp(k)) based, at least in part on the re-clocked reference signal 158 provided to the chirp generation circuitry 123 by the SAR TDC 140. The chirp generation circuitry 123 provides the ramp signal 122 to the PWL control circuitry 120. The PWL control circuitry 120 generates coarse and fine modulation control codes based on the ramp signal 122, which may be selectively provided, via the MUX 148, to the DCO 110 as a modulation input 111 (MOD). The modulation input 111 may modify and control the one or more modulation capacitor banks to cause frequency modulation (e.g., linear frequency modulation/chirping) of the output signal 112. The DCO 110 may receive PLL locking inputs and compensation inputs from the digital loop filter circuitry 146, which may include an acquisition (ACQ) signal 162, a tracking (TR) signal 164, and a Process-Voltage Temperature (PVT) signal 166. These PLL locking inputs may control corresponding capacitor banks (sometimes referred to as "compensation capacitor banks"), selectively modifying the respective capacitances of these capacitor banks to control the phase of the output signal 112 (e.g., to compensate for variations in process, supply voltage, and temperature).

The DCO 110 may receive a modulation input 111 (MOD), which may include a coarse modulation control code 128 and a fine modulation control code 129, and which may control modulation capacitor banks of the DCO 110. For example, the coarse modulation control code 128 and the fine modulation control code 129 may be provided to control a coarse modulation capacitor bank and a fine modulation capacitor bank (e.g., the coarse modulation capacitor bank 212 and the fine modulation capacitor bank 214 of FIG. 2; the coarse modulation capacitor bank 312 and the fine modulation capacitor bank 314 of FIG. 3), respectively as described below.

In one or more embodiments, the PWL calibration circuitry 121 may be configured to provide the coarse modulation control code 128 and the fine modulation control code 129 when calibrating the frequency change from each control code of the modulation capacitor banks of the DCO 110 while the PLL circuitry 100 is locked to a fixed frequency. The calibration of the coarse modulation control code 128 and the fine modulation control code 129 determined using the PWL calibration circuitry 121 may be utilized during subsequent frequency modulation (e.g., "chirping") operations of the PLL circuitry 100. If the PLL circuitry becomes locked to a different combination of PVT, ACQ, and TR capacitances, even if at the same lock frequency, the calibration of the coarse modulation control code 128 and the fine modulation control code 129 may be undesirably invalidated if there is significant lock-state dependency between the compensation capacitor banks and the modulation capacitor banks. In one or more embodiments, the DCO 110 is arranged such that lock-state dependency is avoided or mitigated in order to reduce the likelihood of such calibration invalidation. Such arrangements of the DCO 110 are described in more detail, below.

Figure 2:
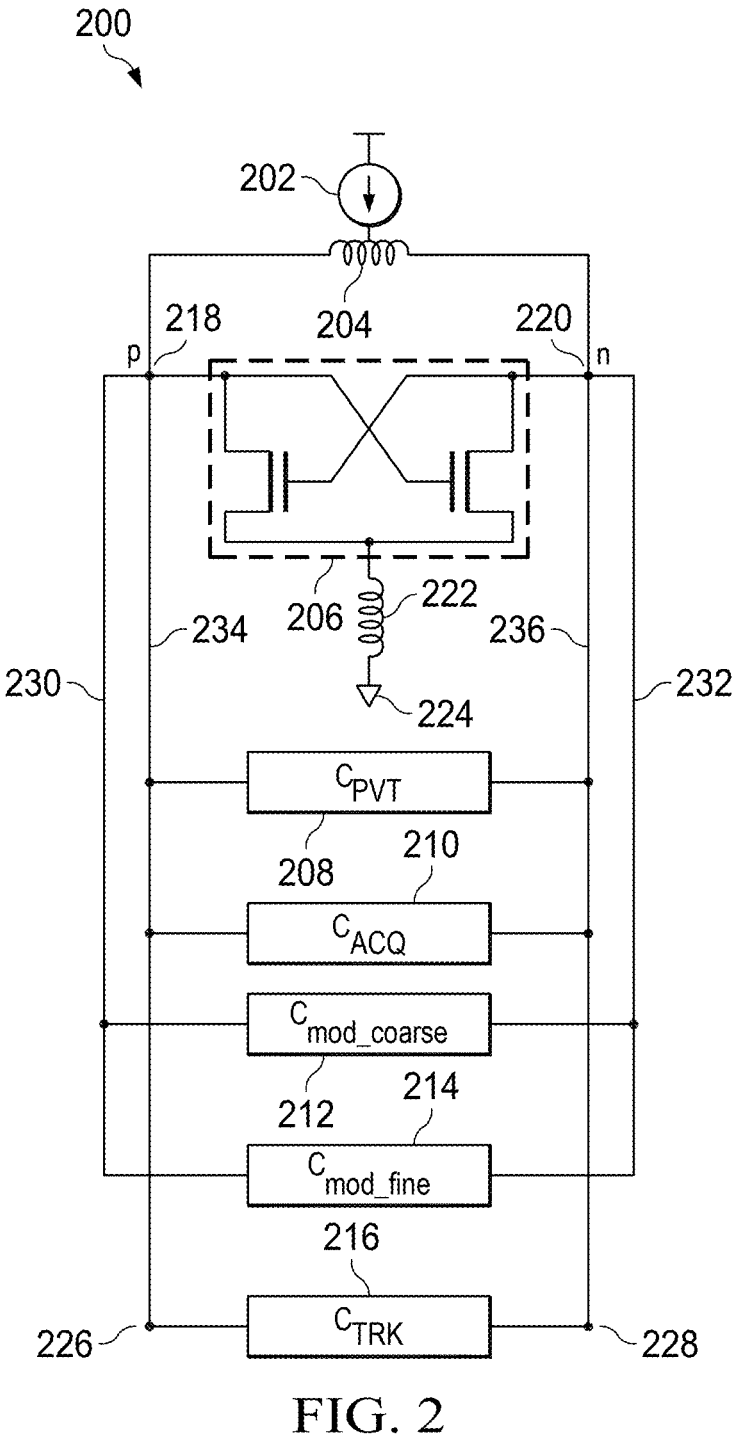
FIG. 2 shows an illustrative circuit diagram of a DCO, such as the DCO of FIG. 1, having modulation capacitor banks coupled between a first pair of traces and other capacitor banks (e.g., Process-Voltage-Temperature (PVT), Acquisition (ACQ), and Tracking (TR) capacitor banks) coupled between a second pair of traces, in accordance with various embodiments.
Figure 3:
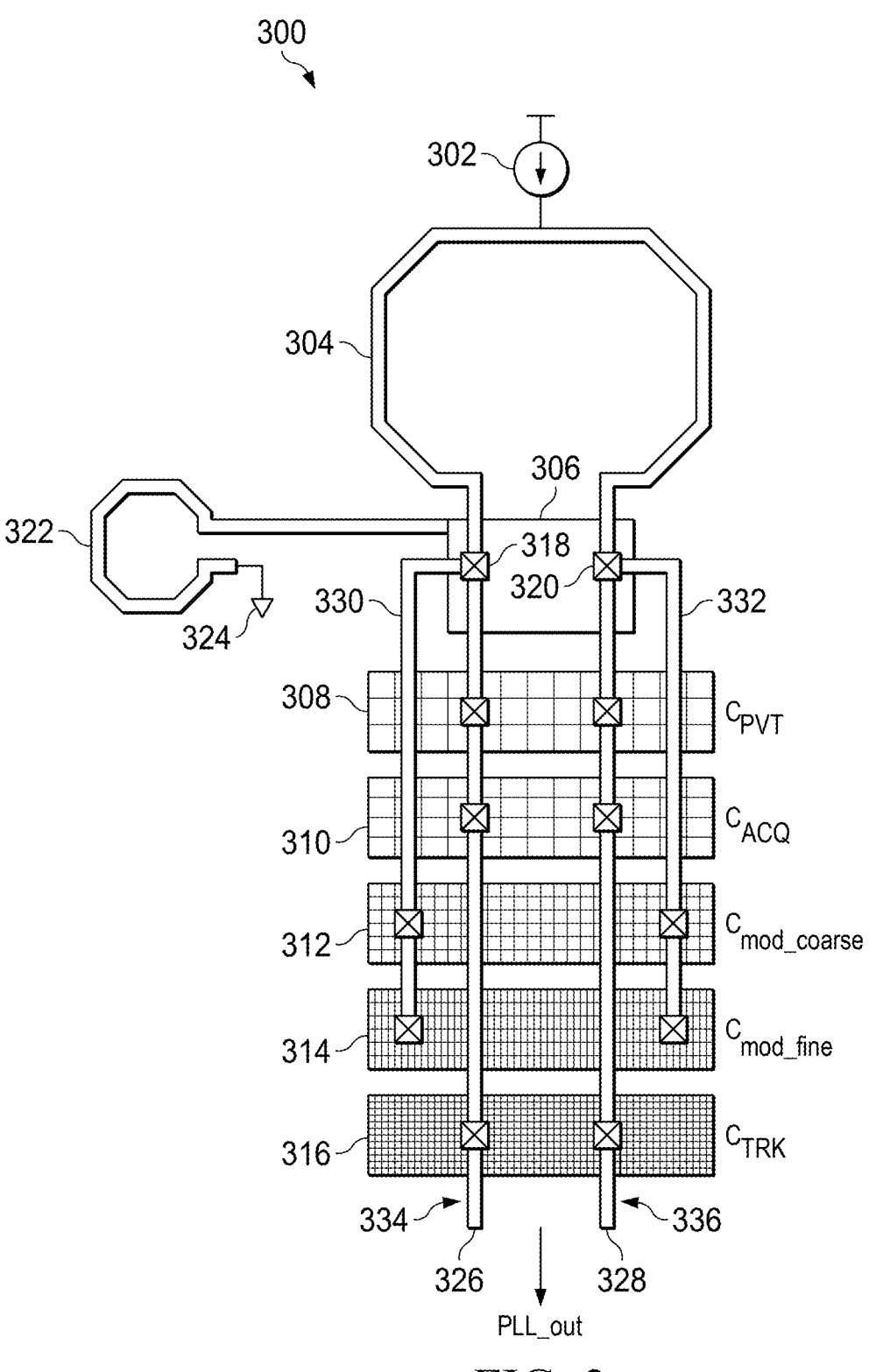
FIG. 3 shows an illustrative top-down view of a DCO, such as the DCO of FIG. 1 or FIG. 2, having modulation capacitor banks coupled between a first pair of traces and other capacitor banks (e.g., Process-Voltage-Temperature (PVT), Acquisition (ACQ), and Tracking (TR) capacitor banks) coupled between a second pair of traces, in accordance with various embodiments.

In one or more embodiments, compensation capacitor banks and the modulation capacitor banks of the DCO 110 may be arranged in a "star configuration" in which the modulation capacitor banks are connected to a negative transconductance stage (e.g., the negative transconductance stage 206 of FIG. 2; the negative transconductance stage 306 of FIG. 3; sometimes referred to herein as a "negative gm stage" or a "negative gm block") via a first path or pair of paths (e.g., paths 230, 232 of FIG. 2; paths 330, 332 of FIG. 3) and the compensation capacitor banks are connected to the negative transconductance stage via a second path or pair of paths (e.g., paths 234, 236 of FIG. 2; paths 334, 336 of FIG. 3). Arranging and connecting the compensation capacitor banks and the modulation capacitor banks of the DCO 110 in such a star configuration, parasitic inductance between the compensation capacitor banks and the modulation capacitor banks may be advantageously reduced, and this reduction in parasitic capacitance may mitigate the impact of changes in compensation capacitor bank states on the calibration of the modulation capacitor banks, as described in more detail below.

FIG. 2 shows a circuit diagram of a DCO 200, which includes modulation capacitor banks and compensation capacitor banks that are connected to a negative transconductance stage in a star configuration. In one or more embodiments, the DCO 200 may be implemented as part of a PLL, such as an ADPLL. In one or more embodiments, the DCO 200 may correspond to the DCO 110 of the PLL circuitry 100 of FIG. 1. As shown, the DCO 200 includes a current source 202, an inductive element 204 (sometimes referred to as a "tank inductor 204"), a negative transconductance stage 206, a Process-Voltage-Temperature (PVT) capacitor bank 208 having an adjustable capacitance $C_{PVT}$, an acquisition (ACQ) capacitor bank 210 having an adjustable capacitance $C_{ACQ}$, a tracking (TRK) capacitor bank 216 having an adjustable capacitance $C_{TRK}$, a coarse modulation capacitor bank 212 having an adjustable capacitance $C_{mod\_coarse}$, a fine modulation capacitor bank 214 having an adjustable capacitance $C_{mod\_fine}$, a positive node 218, a negative node 220, an inductive element 222, a reference node 224 (sometimes referred to herein as a "ground node 224" or a "common node 224" in accordance with various embodiments), a positive output node 226, a negative output node 228, and paths 230, 232, 234, and 236.

As shown, the current source 202 may be coupled to the inductive element 204 and may provide electrical current to the inductive element 204. The inductive element 204 may be coupled between (e.g., connected directly between) the positive node 218 (p) and the negative node 220 (n). The negative transconductance stage 206 may be coupled between (e.g., connected directly between) the positive node 218 and the negative node 220. In one or more embodiments, the negative transconductance stage 206 may include a cross-coupled pair of transistors, with the positive node 218 being connected to a first current-carrying terminal of a first transistor of the cross-coupled pair and to a control (e.g., gate) terminal of a second transistor of the cross-coupled pair, with the negative node 220 being connected to a first current carrying terminal of the second transistor and to a control (e.g., gate) terminal of the first transistor, and the reference node 224 being coupled to a second current-carrying terminal of the first transistor and a second current-carrying terminal of the second transistor via the inductive element 222. The inductive element 222 may be coupled between the negative transconductance stage 206 and the reference node 224. The DCO 200 may provide output signals (e.g., a differential pair of output signals) at the output nodes 226 and 228. In one or more embodiments, the output signals provided at the output nodes 226 and 228 may correspond to the output signal 112 of FIG. 1.

In one or more embodiments, the negative transconductance stage 361 can include a pair of transistors (e.g., p-type metal-oxide-semiconductor (PMOS), n-type metal-oxide-semiconductor (NMOS), bipolar) built using a negative feedback (−R) to reach the DC oscillation condition, and which can be in variety of configurations (e.g., cross coupled, as shown in the present example). In one or more embodiments, the coarse and fine modulation capacitor banks 212 and 214 can be one or more capacitive divider-based banks with programmable resolution. A capacitive divider bank can include different types of capacitive elements (e.g., capacitors, PMOS, NMOS, or bipolar based varactors, as non-limiting examples). A dynamic capacitor bank can be controlled by modulation type (e.g., frequency modulation continuous wave (FMCW) or binary phase shift keying, as non-limiting examples). In one or more embodiments, the capacitor banks 208, 210, and 216 can include several compensation capacitor banks (static), such as static compensation (e.g., band selection, process re-centering, or offset correction due to modulation capacitor bank resolution programmability, as non-limiting examples) and can be made using any suitable capacitive element association. The inductive element 204 creates the resonant frequency with a capacitive load (LC tank) and can be built using ground referred, supply referred, center tapped signal/differential inductor, 8-shape or another shaped inductance or transformer, in accordance with various embodiments.

The connections between the capacitor banks 208, 210, 212, 214, and 216 may have star configurations (sometimes referred to as "star connections") with respect to the positive node 218 and the negative node 220. For example, a first star configuration relative to the positive node 218 may include first and second legs, where the first leg includes the path 230 from the node 218 to the coarse and fine modulation capacitor banks 212 and 214, and the second leg includes the path 234 from the node 218 to the capacitor banks 208, 210, and 216. For example, a second star configuration relative to the negative node 220 may include at least first and second legs, where the first leg includes the path 232 from the node 220 to the coarse and fine modulation capacitor banks 212 and 214, and the second leg includes the path 236 from the node 220 to the capacitor banks 208, 210, and 216. As shown, the capacitor banks 208, 210, and 216 are arranged in parallel with respect to one another between the paths 234 and 236, and the capacitor banks 212 and 214 are arranged in parallel with respect to one another between the paths 230 and 232.

Each of the capacitor banks 208, 210, 212, 214, and 216 may include multiple switchable capacitive blocks, each capacitive block including one or more capacitive elements. The capacitance of each of the capacitor banks 208, 210, 212, 214, and 216 may be controlled in response to respective control signals (e.g., control codes) provided to each of the capacitor banks. For example, a PVT control signal (e.g., the PVT signal 166 provided by the digital loop filter circuitry 146 of FIG. 1) may be provided to the PVT capacitor bank 208 to control the capacitance of (e.g., tune) the PVT capacitor bank 208. For example, an acquisition control signal (e.g., the acquisition signal 162 provided by the digital loop filter circuitry 146 circuitry of FIG. 1) may be provided to the acquisition capacitor bank 210 to control the capacitance of the acquisition capacitor bank 210. For example, a tracking control signal (e.g., the tracking signal 164 provided by the digital loop filter circuitry 146 of FIG. 1) may be provided to the tracking capacitor bank 216 to control the capacitance of the tracking capacitor bank 216. For example, a coarse modulation control signal (e.g., the coarse modulation control code 128 provided by the PWL control circuitry 120 of FIG. 1) may be provided to the coarse modulation capacitor bank 212 and may control the capacitance of the coarse modulation capacitor bank 212. For example, a fine modulation control signal (e.g., the fine modulation control code 129 provided by the PWL control circuitry 120 of FIG. 1) may be provided to the fine modulation capacitor bank 214 and may control the capacitance of the fine modulation capacitor bank 214.

The capacitance of a given capacitor bank of the capacitor banks 208, 210, 212, 214, and 216 may be modified, based on the associated control signal, in discrete steps, where the step size (sometimes referred to herein as a "tuning step size" or "discrete step size"; the amount by which the capacitance of that capacitor bank may be discretely increased or decreased) is determined, at least in part, based on the capacitive block size (e.g., capacitive block capacitance) of that capacitor bank. In one or more embodiments, all capacitive blocks of a given capacitor bank may be of equal or substantially equal size (e.g., equal or substantially equal capacitance). The effective step size for the modulation capacitor banks 212 and 214, as seen from the negative transconductance stage 206 via the positive node 218 (p) and the negative node 220 (n), may be affected by parasitic inductance from the capacitor banks 208, 210, and 216.

For example, in some conventional DCOs, all capacitor banks are coupled along the same path leading to the output of the DCO. In such configuration, there is parasitic inductances between compensation capacitor banks and modulation capacitor banks. Parasitic inductances between such compensation and modulation capacitor banks might further introduce lock-state dependency. If the compensation capacitor banks of such conventional DCOs are locked at different combinations from the combination that was used while performing calibration, the calibration is invalidated. This may lead to degradation of chirp linearity of during modulation (e.g., "chirping") of the output signal(s) provided at the output nodes of such conventional DCOs.

In contrast, by arranging the capacitor banks 208, 210, 212, 214, and 216 in a star configuration, as shown in the present example, the dependency between the modulation capacitor banks 212 and 214 and the compensation capacitor banks 208, 210, and 216 may be advantageously reduced. Due, at least in part, to this reduction in interconnecting parasitic inductance, changing the states of any or all of the capacitor banks 208, 210, and 216 (e.g., resulting in a change in lock-state, which is common during the generation and transmission of chirp signals by the DCO 200) has a desirably reduced effect on the step size and calibration of the modulation capacitor banks 212 and 214. Herein, "lock-state" can refer to the combination of capacitances of the compensation capacitor banks (e.g., the compensation capacitor banks 208, 210, and 216) used to lock the PLL to a fixed frequency, with different combinations of capacitances corresponding to different lock-states. For the same lock frequency, the compensation capacitor banks can have different lock-states (different combinations of frequencies), which can be difficult to control.

For example, changes to the lock state of the capacitor banks 208, 210, and 216 would typically result in invalidation of the calibration of the modulation capacitor banks 212 and 214 if all capacitor banks 208, 210, 212, 214, and 216 were directly coupled along the paths 234 and 236, whereas such calibration invalidation may be mitigated or altogether avoided by arranging the capacitor banks 208, 210, 212, 214, and 216 in the star configuration of the present example. By protecting the calibration of the modulation capacitor banks 212 and 214 in this way, frequency errors that might otherwise degrade chirp linearity may be advantageously reduced or avoided, thereby providing for comparatively higher chirp linearity with improved robustness.

FIG. 3 shows a top-down view of a DCO 300, which includes modulation capacitor banks and compensation capacitor banks that are connected to a negative transconductance stage in a star configuration. In one or more embodiments, the DCO 300 may be implemented as part of a PLL, such as an ADPLL. In one or more embodiments, the DCO 300 may correspond to the DCO 110 of the PLL circuitry 100 of FIG. 1. In one or more embodiments, the DCO 300 may correspond to the DCO 200 of FIG. 2, where various aspects of the DCO 300 are similar to those of the DCO 200 of FIG. 2, and descriptions of such aspects are not necessarily repeated here for sake of brevity. As shown, the DCO 300 includes a current source 302, an inductive element 304, a negative transconductance stage 306, a PVT capacitor bank 308 having an adjustable capacitance $C_{PVT}$, an acquisition (ACQ) capacitor bank 310 having an adjustable capacitance $C_{ACQ}$, a tracking (TRK) capacitor bank 316 having an adjustable capacitance $C_{TRK}$, a coarse modulation capacitor bank 312 having an adjustable capacitance $C_{mod\_coarse}$, a fine modulation capacitor bank 314 having an adjustable capacitance $C_{mod\_fine}$, a positive node 318, a negative node 320, an inductive element 322, a reference node 324 (sometimes referred to herein as a "ground node 324" or a "common node 324" in accordance with various embodiments), a positive output node 326, a negative output node 328, and paths 330, 332, 334, and 336.

As shown, the current source 302 may be coupled to the inductive element 304 and may provide electrical current to the inductive element 304. In one or more embodiments, as shown in the present example, the inductive element 304 includes an inductive loop, and the current source 302 is coupled to a mid-point ("center tap") of the inductive loop. The inductive element 304 may be coupled between (e.g., connected directly between) the positive node 318 and the negative node 320. The negative transconductance stage 306 may be coupled between (e.g., connected directly between) the positive node 318 and the negative node 320. In one or more embodiments, the negative transconductance stage 306 may include a cross-coupled pair of transistors, with the positive node 318 being connected to a first current-carrying terminal of a first transistor of the cross-coupled pair and to a control (e.g., gate) terminal of a second transistor of the cross-coupled pair, with the negative node 320 being connected to a first current carrying terminal of the second transistor and to a control (e.g., gate) terminal of the first transistor, and the reference node 324 being coupled to a second current-carrying terminal of the first transistor and a second current-carrying terminal of the second transistor via the inductive element 322. In one or more embodiments, as shown in the present example, the inductive element 322 may include an inductive loop. The inductive element 322 may be coupled (e.g., directly connected, in one or more embodiments) between the negative transconductance stage 306 and the reference node 324. The DCO 300 may provide output signals (e.g., a differential pair of output signals) at the output nodes 326 and 328. In one or more embodiments, the output signals provided at the output nodes 326 and 328 may correspond to the output signal 112 of FIG. 1.

The connections between the capacitor banks 308, 310, 312, 314, and 316 may have star configurations (sometimes referred to as "star connections") with respect to the positive node 318 and the negative node 320. For example, a first star configuration relative to the positive node 318 may include first and second legs, where the first leg includes the path 330 from the node 318 to the coarse and fine modulation capacitor banks 312 and 314, and the second leg includes the path 334 from the node 318 to the capacitor banks 308, 310, and 316. For example, a second star configuration relative to the negative node 320 may include first and second legs, where the first leg includes the path 332 from the node 320 to the coarse and fine modulation capacitor banks 312 and 314, and the second leg includes the path 336 from the node 320 to the capacitor banks 308, 310, and 316.

In one or more embodiments, the paths 330, 332, 334, and 336 may be electrically conductive traces. In one or more embodiments, the DCO 300 may be formed on or above a substrate (e.g., a semiconductor substrate, such as a silicon substrate) using multiple metal layers (e.g., "multi-layer metal stacks"). For example, the paths 330, 332, 334, and 336 may be formed in a first (e.g., top) metal layer over the substrate. For example, the capacitor banks 308, 310, 312, 314, and 316 may be formed in one or more other metal layers that are disposed over the substrate and below the first metal layer in which the paths 330, 332, 334, and 336 are formed. In one or more such embodiments, the capacitor banks 312 and 314 may be connected to the paths 330 and 332 using electrically conductive vias, and the capacitor banks 308, 310, and 316 may be connected to the paths 334 and 336 using electrically conductive vias.

Each of the capacitor banks 308, 310, 312, 314, and 316 may include multiple switchable capacitive blocks, each capacitive block including one or more capacitive elements. The capacitance of each of the capacitor banks 308, 310, 312, 314, and 316 may be controlled in response to respective control signals (e.g., control codes) provided to each of the capacitor banks. For example, a PVT control signal (e.g., the PVT signal 166 provided by the digital loop filter circuitry 146 of FIG. 1) may be provided to the PVT capacitor bank 308 to control the capacitance of (e.g., tune) the PVT capacitor bank 308. For example, an acquisition control signal (e.g., the acquisition signal 162 provided by the digital loop filter circuitry 146 of FIG. 1) may be provided to the acquisition capacitor bank 310 to control the capacitance of the acquisition capacitor bank 310. For example, a tracking control signal (e.g., the tracking signal 164 provided by the digital loop filter circuitry 146 of FIG. 1) may be provided to the tracking capacitor bank 316 to control the capacitance of the tracking capacitor bank 316. For example, a coarse modulation control signal (e.g., the coarse modulation control code 128 provided by the PWL control circuitry 120 of FIG. 1) may be provided to the coarse modulation capacitor bank 312 and may control the capacitance of the coarse modulation capacitor bank 312. For example, a fine modulation control signal (e.g., the fine modulation control code 129 provided by the PWL control circuitry 120 of FIG. 1) may be provided to the fine modulation capacitor bank 314 and may control the capacitance of the fine modulation capacitor bank 314.

The capacitance of a given capacitor bank of the capacitor banks 308, 310, 312, 314, and 316 may be modified, based on the associated control signal, in discrete steps, where the step size (sometimes referred to herein as a "tuning step size"; the amount by which the capacitance of that capacitor bank may be discretely increased or decreased) is determined, at least in part, based on the capacitive block size (e.g., capacitive block capacitance) of that capacitor bank. In one or more embodiments, all capacitive blocks of a given capacitor bank may be of equal or substantially equal size (e.g., equal or substantially equal capacitance).

In the present example, the capacitive blocks of the capacitor banks 308, 310, 312, 314, and 316 are shown as respective arrays of squares, with the comparative size of the squares of one capacitor bank indicating comparatively larger or smaller capacitive block size compared to other capacitor banks represented with comparatively smaller or larger squares. In one or more embodiments, the capacitor banks 308, 310, 312, 314, and 316 may be arranged in order of tuning step size (e.g., capacitive block size) in order to minimize or otherwise reduce phase noise in comparison to other arrangements. For example, the capacitive block size, and, therefore, tuning step size, of the PVT capacitor bank 308 may be greater than that of the acquisition capacitor bank 310. The capacitive block size, and, therefore, tuning step size, of the acquisition capacitor bank 310 may be greater than that of the coarse modulation capacitor bank 312. The capacitive block size, and, therefore, tuning step size, of the coarse modulation capacitor bank 312 may be greater than that of the fine modulation capacitor bank 314. The capacitive block size, and, therefore, tuning step size, of the fine modulation capacitor bank 314 may be greater than that of the tracking capacitor bank 316. As shown, the capacitor banks 308, 310, 312, 314, and 316 may be arranged in the following order: the PVT capacitor bank 308 (closest to the negative transconductance stage 306), followed by the acquisition capacitor bank 310, followed by the coarse modulation capacitor bank 312, followed by the fine modulation capacitor bank 314, followed by the tracking capacitor bank 316 (closest to the output nodes 326, 328 and furthest from the negative transconductance stage 306).

The effective step size for the modulation capacitor banks 312 and 314, as seen from the negative transconductance stage 306 via the positive node 318 and the negative node 320, may be affected by parasitic inductance from the capacitor banks 308, 310, and 316, though this effect may be reduced by the start configuration of the capacitor banks 308, 310, 312, 314, and 316. For example, the star configuration of the capacitor banks 308, 310, 312, 314, and 316 may be advantageous over conventional arrangements in which all capacitor banks are coupled along the same path to the DCO output due to reduced effects of parasitic inductance from the capacitor banks 308, 310, and 316 on the modulation capacitor banks 312 and 314. This reduction in the effect of parasitic inductance on the modulation capacitor banks 312 and 314 may advantageously avoid or reduce the likelihood of modulation capacitor bank calibration and associated frequency errors and chirp linearity degradation, as described above.

Various exemplary embodiments are presented below. Some simplifications and omissions may be made in the following examples, which are intended to highlight and introduce some aspects of the various exemplary embodiments, without limiting the scope.

In an example embodiment, an oscillator includes a first plurality of capacitor banks coupled to a first path and a second path, the first path connecting a first node to a first output node, and the second path connecting a second node to a second output node, and a second plurality of capacitor banks coupled to a third path and a fourth path, the third path being connected to the first node, the fourth path being connected to the second node, the first and second paths being separate from the third and fourth paths, and the second plurality of capacitor banks including at least one modulation capacitor bank.

In one or more embodiments, the at least one modulation capacitor bank is configured to receive at least a first control signal that modifies at least one capacitance of the at least one modulation capacitor bank, and the at least one modulation capacitor bank is configured to cause frequency modulation of an output signal of the oscillator.

In one or more embodiments, the first plurality of capacitor banks includes a Process-Voltage-Temperature (PVT) capacitor bank configured to receive a second control signal, an acquisition capacitor bank configured to receive a third control signal, and a tracking capacitor bank configured to receive a fourth control signal. The second control signal, the third control signal and the fourth control signal modify capacitances of the PVT capacitor bank, the acquisition capacitor bank, and the tracking capacitor bank, respectively, to achieve phase lock for a phase-locked loop (PLL)

that includes the oscillator and, at least in part, to compensate for variations in process, supply voltage, or temperature of the oscillator.

In one or more embodiments, the at least one modulation capacitor bank includes a fine modulation capacitor bank having a first discrete step size and a coarse modulation capacitor bank having a second discrete step size that is greater than the first discrete step size.

In one or more embodiments, the first plurality of capacitor banks are arranged in parallel between the first path and the second path, and the second plurality of capacitor banks are arranged in parallel between the third path and the fourth path.

In one or more embodiments, the first plurality of capacitor banks and the second plurality of capacitor banks are arranged from the first and second nodes to the output nodes in order of decreasing discrete step size, and the discrete step size for a given capacitor bank of the first plurality of capacitor banks or the second plurality of capacitor banks is based on a capacitive block size of the given capacitor bank.

In one or more embodiments, the oscillator further includes a current source, a first inductive element coupled to the current source and coupled between the first node and the second node, a negative transconductance stage coupled between the first node and the second node, and a second inductive element between the negative transconductance stage and a reference node.

In one or more embodiments, the oscillator is a digitally controlled oscillator (DCO).

In an example embodiment, phase-locked loop (PLL) circuitry includes an oscillator that includes a first plurality of capacitor banks coupled to a first path and a second path, the first path connecting a first node to a first output node, and the second path connecting a second node to a second output node, and a second plurality of capacitor banks coupled to a third path and a fourth path, the third path being connected to the first node, the fourth path being connected to the second node, the first and second paths being separate from the third and fourth paths, and the second plurality of capacitor banks including at least one modulation capacitor bank.

In one or more embodiments, the at least one modulation capacitor bank is configured to receive at least a first control signal that modifies at least one capacitance of the at least one modulation capacitor bank, and the at least one modulation capacitor bank is configured to cause frequency modulation of an output signal of the oscillator.

In one or more embodiments, the first plurality of capacitor banks includes a Process-Voltage-Temperature (PVT) capacitor bank configured to receive a second control signal, an acquisition capacitor bank configured to receive a third control signal, and a tracking capacitor bank configured to receive a fourth control signal. The second control signal, the third control signal and the fourth control signal modify capacitances of the PVT capacitor bank, the acquisition capacitor bank and the tracking capacitor bank, respectively, to achieve phase lock for the PLL circuitry.

In one or more embodiments, the PLL circuitry further includes digital loop filter circuitry configured to generate the second, third and fourth control signals and to provide the second, third, and fourth control signals to the oscillator, chirp generation circuitry configured to generate a ramp signal, and control circuitry configured to generate the first control signal based on the ramp signal and to provide the first control signal to the oscillator.

In one or more embodiments, the at least one modulation capacitor bank includes a fine modulation capacitor bank having a first discrete step size and a coarse modulation capacitor bank having a second discrete step size that is greater than the first discrete step size.

In one or more embodiments, the first plurality of capacitor banks are arranged in parallel between the first path and the second path, and the second plurality of capacitor banks are arranged in parallel between the third path and the fourth path.

In one or more embodiments, the first plurality of capacitor banks and the second plurality of capacitor banks are arranged from the first and second nodes to the output nodes in order of decreasing discrete step size, and the discrete step size for a given capacitor bank of the first plurality of capacitor banks or the second plurality of capacitor banks is based on a capacitive block size of the given capacitor bank.

In one or more embodiments, the oscillator further includes a current source, a first inductive element coupled to the current source and coupled between the first node and the second node, a negative transconductance stage coupled between the first node and the second node, and a second inductive element between the negative transconductance stage and a reference node.

In one or more embodiments, the oscillator is a digitally controlled oscillator (DCO).

In an example embodiment, a Digitally Controlled Oscillator (DCO) includes a negative transconductance stage coupled to a first node, a second node, and a reference node, a first plurality of capacitor banks coupled to a first path and a second path, the first path connecting the first node to a first output node, and the second path connecting the second node to a second output node, at least one of the first plurality of capacitor banks being controlled to achieve a phase lock for a phase-locked loop (PLL) that includes the DCO, and a second plurality of capacitor banks coupled to a third path and a fourth path, the third path being connected to the first node, the fourth path being connected to the second node, the first and second paths being separate from the third and fourth paths, and the second plurality of capacitor banks including at least one modulation capacitor bank that is controlled to modulate at least one output signal of the DCO.

In one or more embodiments, the first plurality of capacitor banks includes a first capacitor bank having a first discrete step size, a second capacitor bank having a second discrete step size, and a third capacitor bank having a third discrete step size, the second plurality of capacitor banks includes a fine modulation capacitor bank having a fourth discrete step size and a coarse modulation capacitor bank having a fifth discrete step size, the first discrete step size is greater than the second discrete step size, the second discrete step size is greater than the fourth discrete step size, the fourth discrete step size is greater than the fifth discrete step size, the fifth discrete step size is greater than the third discrete step size, and the first and second pluralities of capacitor banks are arranged between the negative transconductance stage and the first and second output nodes in order of decreasing step size.

In one or more embodiments, the first plurality of capacitor banks are arranged in parallel between the first path and the second path, and the second plurality of capacitor banks are arranged in parallel between the third path and the fourth path.

While at least one exemplary embodiment has been presented in the foregoing detailed description, it should be appreciated that a vast number of variations exist. It should also be appreciated that exemplary embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An oscillator comprising:

a first plurality of capacitor banks coupled to a first path and a second path, the first path connecting a first node to a first output node, and the second path connecting a second node to a second output node; and a second plurality of capacitor banks coupled to a third path and a fourth path, the third path being connected to the first node, the fourth path being connected to the second node, the first and second paths being separate from the third and fourth paths, and the second plurality of capacitor banks including at least one modulation capacitor bank, wherein the at least one modulation capacitor bank comprises a fine modulation capacitor bank having a first discrete step size and a coarse modulation capacitor bank having a second discrete step size that is greater than the first discrete step size.

2. The oscillator of claim 1, wherein the at least one modulation capacitor bank is configured to receive at least a first control signal that modifies at least one capacitance of the at least one modulation capacitor bank, and the at least one modulation capacitor bank is configured to cause frequency modulation of an output signal of the oscillator.

3. The oscillator of claim 2, wherein the first plurality of capacitor banks comprises:

a Process-Voltage-Temperature (PVT) capacitor bank configured to receive a second control signal;

an acquisition capacitor bank configured to receive a third control signal; and a tracking capacitor bank configured to receive a fourth control signal, wherein the second control signal, the third control signal and the fourth control signal modify capacitances of the PVT capacitor bank, the acquisition capacitor bank, and the tracking capacitor bank, respectively, to achieve phase lock for a phase-locked loop (PLL) that includes the oscillator and, at least in part, to compensate for variations in process, supply voltage, or temperature of the oscillator.

4. The oscillator of claim 1, wherein the first plurality of capacitor banks are arranged in parallel between the first path and the second path, and the second plurality of capacitor banks are arranged in parallel between the third path and the fourth path.

5. The oscillator of claim 1, wherein the first plurality of capacitor banks and the second plurality of capacitor banks are arranged from the first and second nodes to the output nodes in order of decreasing discrete step size, and wherein the discrete step size for a given capacitor bank of the first plurality of capacitor banks or the second plurality of capacitor banks is based on a capacitive block size of the given capacitor bank.

6. The oscillator of claim 1, wherein the oscillator further comprises:

a current source;

a first inductive element coupled to the current source and coupled between the first node and the second node;

a negative transconductance stage coupled between the first node and the second node; and a second inductive element between the negative transconductance stage and a reference node.

7. The oscillator of claim 1, wherein the oscillator is a digitally controlled oscillator (DCO).

8. Phase-locked loop (PLL) circuitry comprising:

an oscillator comprising:

a first plurality of capacitor banks coupled to a first path and a second path, the first path connecting a first node to a first output node, and the second path connecting a second node to a second output node;

a second plurality of capacitor banks coupled to a third path and a fourth path, the third path being connected to the first node, the fourth path being connected to the second node, the first and second paths being separate from the third and fourth paths, and the second plurality of capacitor banks including at least one modulation capacitor bank;

a current source;

a first inductive element coupled to the current source and coupled between the first node and the second node;

a negative transconductance stage coupled between the first node and the second node; and a second inductive element between the negative transconductance stage and a reference node.

9. The PLL circuitry of claim 8, wherein the at least one modulation capacitor bank is configured to receive at least a first control signal that modifies at least one capacitance of the at least one modulation capacitor bank, and the at least one modulation capacitor bank is configured to cause frequency modulation of an output signal of the oscillator.

10. The PLL circuitry of claim 9, wherein the first plurality of capacitor banks comprises:

a Process-Voltage-Temperature (PVT) capacitor bank configured to receive a second control signal;

an acquisition capacitor bank configured to receive a third control signal; and a tracking capacitor bank configured to receive a fourth control signal, wherein the second control signal, the third control signal and the fourth control signal modify capacitances of the PVT capacitor bank, the acquisition capacitor bank and the tracking capacitor bank, respectively, to achieve phase lock for the PLL circuitry.

11. The PLL circuitry of claim 10, further comprising:

digital loop filter circuitry configured to generate the second, third and fourth control signals and to provide the second, third, and fourth control signals to the oscillator;

chirp generation circuitry configured to generate a ramp signal; and control circuitry configured to generate the first control signal based on the ramp signal and to provide the first control signal to the oscillator.

12. The PLL circuitry of claim 8, wherein the at least one modulation capacitor bank comprises a fine modulation capacitor bank having a first discrete step size and a coarse modulation capacitor bank having a second discrete step size that is greater than the first discrete step size.

13. The PLL circuitry of claim 8, wherein the first plurality of capacitor banks are arranged in parallel between the first path and the second path, and the second plurality of capacitor banks are arranged in parallel between the third path and the fourth path.

14. The PLL circuitry of claim 8, wherein the first plurality of capacitor banks and the second plurality of capacitor banks are arranged from the first and second nodes to the output nodes in order of decreasing discrete step size, and wherein the discrete step size for a given capacitor bank of the first plurality of capacitor banks or the second plurality of capacitor banks is based on a capacitive block size of the given capacitor bank.

15. The PLL circuitry of claim 14, wherein the oscillator is a digitally controlled oscillator (DCO).

16. A Digitally Controlled Oscillator (DCO) comprising:

a negative transconductance stage coupled to a first node, a second node, and a reference node;

a first plurality of capacitor banks coupled to a first path and a second path, the first path connecting the first node to a first output node, and the second path connecting the second node to a second output node, wherein at least one of the first plurality of capacitor banks is controlled to achieve a phase lock for a phase-locked loop (PLL) that includes the DCO; and a second plurality of capacitor banks coupled to a third path and a fourth path, the third path being connected to the first node, the fourth path being connected to the second node, the first and second paths being separate from the third and fourth paths, and the second plurality of capacitor banks including at least one modulation capacitor bank that is controlled to modulate at least one output signal of the DCO, wherein:

the first plurality of capacitor banks includes a first capacitor bank having a first discrete step size, a second capacitor bank having a second discrete step size, and a third capacitor bank having a third discrete step size, the second plurality of capacitor banks includes a fine modulation capacitor bank having a fourth discrete step size and a coarse modulation capacitor bank having a fifth discrete step size, the first discrete step size is greater than the second discrete step size, the second discrete step size is greater than the fourth discrete step size, the fourth discrete step size is greater than the fifth discrete step size, the fifth discrete step size is greater than the third discrete step size, and the first and second pluralities of capacitor banks are arranged between the negative transconductance stage and the first and second output nodes in order of decreasing step size.

17. The DCO of claim 16, wherein the first plurality of capacitor banks are arranged in parallel between the first path and the second path, and the second plurality of capacitor banks are arranged in parallel between the third path and the fourth path.

* * * * *